(12) United States Patent
Smith et al.

(10) Patent No.: US 9,350,366 B2
(45) Date of Patent: May 24, 2016

(54) PHASE-LOCKED LOOP FILTER WITH COARSE AND FINE TUNING

(71) Applicant: Raytheon Company, Waltham, MA (US)

(72) Inventors: Robert J. Smith, Fort Wayne, IN (US); Steven Hand, Fort Wayne, IN (US)

(73) Assignee: Raytheon Company, Waltham, MA (US)

( * ) Notice: Subject to any disclaimer, the term of this patent is extended or adjusted under 35 U.S.C. 154(b) by 336 days.

(21) Appl. No.: 14/057,276

(22) Filed: Oct. 18, 2013

(65) Prior Publication Data

US 2015/0109035 A1    Apr. 23, 2015

(51) Int. Cl.
| | |
|---|---|
| *H03L 7/06* | (2006.01) |
| *H03L 7/189* | (2006.01) |
| *H03L 7/089* | (2006.01) |
| *H03L 7/093* | (2006.01) |
| *H03L 7/107* | (2006.01) |

(52) U.S. Cl.
CPC .............. *H03L 7/189* (2013.01); *H03L 7/0891* (2013.01); *H03L 7/093* (2013.01); *H03L 7/1075* (2013.01)

(58) Field of Classification Search
CPC ................................ H03L 7/1075; H03L 7/06
See application file for complete search history.

(56) References Cited

U.S. PATENT DOCUMENTS

| | | |
|---|---|---|
| 4,580,107 A | 4/1986 | Caldwell et al. |
| 5,304,956 A | 4/1994 | Egan |
| 6,380,810 B1 | 4/2002 | Sutton |
| 6,553,089 B2 | 4/2003 | Huh et al. |
| 6,774,731 B2 | 8/2004 | Magazzu et al. |
| 6,774,732 B1 | 8/2004 | Harnishfeger et al. |
| 8,130,047 B2 | 3/2012 | Finocchiaro et al. |
| 2007/0182469 A1* | 8/2007 | Zimlich ............... H03L 7/0814 327/158 |
| 2012/0025880 A1 | 2/2012 | Romano et al. |

* cited by examiner

*Primary Examiner* — Hai L Nguyen
(74) *Attorney, Agent, or Firm* — Daly, Crowley, Mofford & Durkee, LLP

(57) ABSTRACT

A loop filter for a phase locked loop (PLL) having fast tuning capability while limiting phase noise. The filter includes a fine tune input port to receive a fine tune signal from the phase detector and a coarse tune input port to receive a coarse tune signal from the coarse tuner. The external coarse tuner provides the majority of the voltage slew on the loop filter while a fine tune control, thus reducing tune time. In one embodiment, the loop filter includes a voltage divider to limit the effective tuning sensitivity and thus control noise induced on a voltage-controlled oscillator from the loop filter. An elliptical filter may be employed to attenuate fractional spurs within the filter output signal.

13 Claims, 3 Drawing Sheets

PHASE-LOCKED LOOP FILTER WITH COARSE AND FINE TUNING

BACKGROUND

The use of a voltage-controlled oscillator (VCO) in phase-locked loop (PLL) designs is well known in the art and such designs are widely employed in radio, telecommunication, computer, and other electronic applications. In electronic systems that use PLLs, the time required for a PLL to tune, that is to achieve lock, is usually important to its operation.

The time for a PLL to tune is dependent upon a number of factors, such as the loop's bandwidth, voltage slew, damping factor, frequency step size, etc. In particular, voltage slew time on the PLL can impose a hard limit on how fast tuning can take place, which is especially troublesome with VCOs that have a large voltage range on the tune line. In addition, fast tuning capabilities may introduce multiple types of noise on the VCO tune line, including filtering noise, VCO interferences, phase noise, and spurs. In general, as tuning time decreases, the sensitivity of the PLL increases, and thus, becomes more susceptible to low noise levels and spurs.

Attempts have been made to improve PLL tuning time without introducing excess noise in the output signal. For example, several existing PLL designs use a coarse tuning technique in which a coarse tuning circuit provides the majority of voltage slew and a fine tuning circuit provides the remaining voltage slew. However, many existing coarse tune circuits require a VCO having two tune lines (a coarse tune line and a fine tune line) and/or other additional circuitry, which may be expensive. In addition, existing coarse tune circuits are vulnerable to imposing excess phase noise on the VCO tune line.

SUMMARY

Presently described is a phased-locked loop (PLL) filter circuit comprising a fine tune input port to receive a fine tune signal; a coarse tune input port to receive a coarse tune signal; an output port; a first summing element coupled to the fine tune and coarse tune input ports to sum the fine tune and coarse tune signals and to output a summed tune signal; a voltage divider coupled to the first summing element to receive the summed tune signal and to output a voltage divided signal; and a smoothing filter coupled to the voltage divider and the output port to smooth the voltage divided signal and output an final tune signal to the output port.

In embodiments, the PLL filter circuit further comprises a voltage source to output a nominal voltage; and a second summing element coupled to the voltage source, the fine tune input port, and the first summing element, the second summing element to sum the fine tune signal and the nominal voltage. In one embodiment, the first summing element and/or the second summing element comprises an operational amplifier ("op-amp"). In some embodiments, the fine tune signal comprises a voltage signal, the coarse tune signal comprises a voltage signal, and a voltage range for the fine tune signal s less than voltage range for the coarse tune signal. According to one embodiment, the smoothing filter comprises an elliptical filter.

Also presently described is a phase-locked loop (PLL) comprising a phase detector; a coarse tuner; a voltage-controller oscillator (VCO); and a loop filter coupled to the phase detector, the coarse tuner, and the VCO, the loop filter comprising: a fine tune input port to receive a fine tune signal from the phase detector; a coarse tune input port to receive a coarse tune signal from the coarse tuner; an output port; a summing element coupled to the fine tune and coarse tune input ports to sum the fine tune and coarse tune signals and to output a summed tune signal; a voltage divider coupled to the summing element to receive the summed tune signal and output a voltage divided signal; and a smoothing filter coupled to the voltage divider and the output port to smooth the voltage divided signal and output a final tune signal to tune the VCO.

In some embodiments, the RLL further comprises a charge pump coupled to the phase detector and the bop filter, the fine tune input port to receive the fine tune signal from the charge pump. The charge pump can receive an UP control signal and a DOWN control signal from the phase detector. According embodiments, the coarse tuner comprises a digital-to-analog converter (DAC) and/or a multi-throw switch connected to a voltage divider.

Also presently described is a circuit comprising a coarse tuning means for providing a coarse tune signal; a fine tuning means for providing a fine tune signal; a filtering means for receiving the fine tune and coarse time input signals and providing a final tune signal to a voltage-controlled oscillator (VCO), wherein the final tune signal amplitude is proportional to the sum of the fine tune and coarse tune input signal amplitudes. The filtering means may comprise a division means for limiting the effective tuning sensitivity within the final tune signal. In embodiments, the filtering means attenuates fractional spurs within the final tune signal.

BRIEF DESCRIPTION OF THE DRAWINGS

Various embodiments of the invention may be more fully understood from the following detailed description of the drawings, in which.

DETAILED DESCRIPTION

Figure 1:
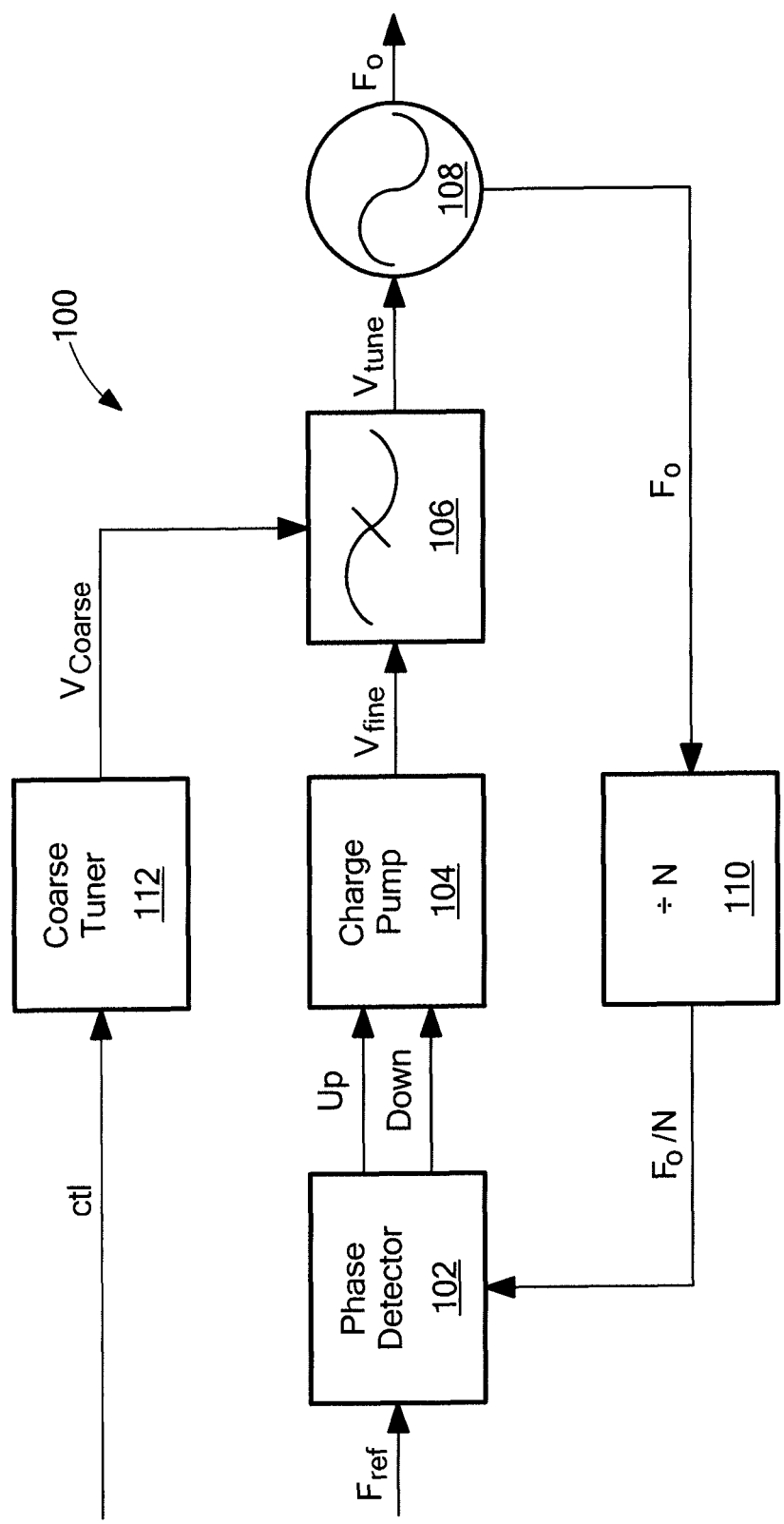
FIG. 1 is a block diagram showing a phase-locked loop (PLL)

Referring to FIG. 1, an exemplary phase-locked loop (PLL) 100 includes a phase detector 102, a charge pump 104, a loop filter 106, a voltage-controlled oscillator (VCO) 108, and a divider 110 connected in a series loop as shown. In addition, an external coarse tuner 112 is coupled to the loop filter 106. The PLL 100 generally receives an input reference signal $F_{ref}$ and tunes the VCO 108 such that the VCO output signal $F_0$ achieves phase lock with the reference signal $F_{ref}$. Here, phase lock means that the difference between the input and output signal phases will remain constant over time. The time required to tune the VCO is referred to as the "tuning time." It should be appreciated that, once the input signal $F_{ref}$ and output signal $F_0$ are in phase lock, then $F_0$ will have the same frequency as $F_{ref}$N.

The phase detector 102 (sometimes referred to as a "phase-frequency detector"), generally receives input signals including the reference signal $F_{ref}$ and the feedback signal $F_0/N$ and outputs one or more control signals indicative of the phase and/or frequency difference between the two input signals. It is understood that any type of suitable phase detector can be used including analog and digital detectors. In one embodiment, the phase detector 102 outputs first and second control signals, shown as UP and DOWN, to control the charge pump 104, as discussed further below.

The coarse tuner 112 may receive an external control signal ctl and provide a coarse tune signal $V_{coarse}$ to the loop filter 106. In one embodiment, the external control signal ctl is a digital signal and the coarse tuner 112 may utilize a digital-to-analog converter (DAC) to produce the coarse tune signal $V_{coarse}$. In another embodiment, the coarse tuner 112 may use a multi-throw switch connected to a voltage divider network. The coarse tuner 112 may include an R-C filter (not shown) to reduce phase noise in the coarse tune signal $V_{coarse}$.

The charge pump 104 receives the UP and DOWN control signals from the phase detector 102 and provides a fine tune signal $V_{fine}$ to the loop filter 106, whereby frequency pulses on the UP and DOWN control signals are used to apply a charge to the loop filter 106. More specifically, if the phase detector 102 indicates to charge pump 104 to move UP in frequency then a voltage charge is sent to the loop filter to cause an incremental increase in frequency. Conversely, if the phase detector 102 indicates to move DOWN in frequency, then the charge pump 104 provides the appropriate charge to the loop filter 106 to make that incremental decrease in frequency. Charges pumps that receive UP and DOWN control signals are known in the art, for example U.S. Pat. No. 6,774,731 ("System and Method for Coarse Tuning a Phase Locked Loop (PLL) Synthesizer Using 2-Pl Slip Detection"), which is incorporated herein by reference. For simplicity of explanation, the tune signals $V_{coarse}$ and $V_{fine}$ may be referred to herein as voltages or voltage signals.

The loop filter 106 will be discussed in further detail below in conjunction with FIGS. 2 and 3. Suffice it to say here, the loop filter 106 generally sums the fine tune signal $V_{fine}$ and the coarse tune signal $V_{coarse}$ to generate a summed tune signal, and then reduces/eliminates phase noise within the summed tune signal to provide a final tune signal $V_{tune}$ that is suitable to control the VCO 108.

In some embodiments, a divider 110 having a rational frequency multiplier 1/N can be provided along the PLL feedback path, as shown in FIG. 1, where N is an integer. As discussed above, the PLL 100 generates an output signal $F_O$ which generally has the same frequency as the input reference signal $F_{ref}$. By providing a divider 110 along the feedback path, the PLL 100 can further generate an output signal $F_O/N$ (also referred to as the "feedback signal") having a frequency which is a rational multiple 1/N of the reference signal $F_{ref}$.

Figure 2:
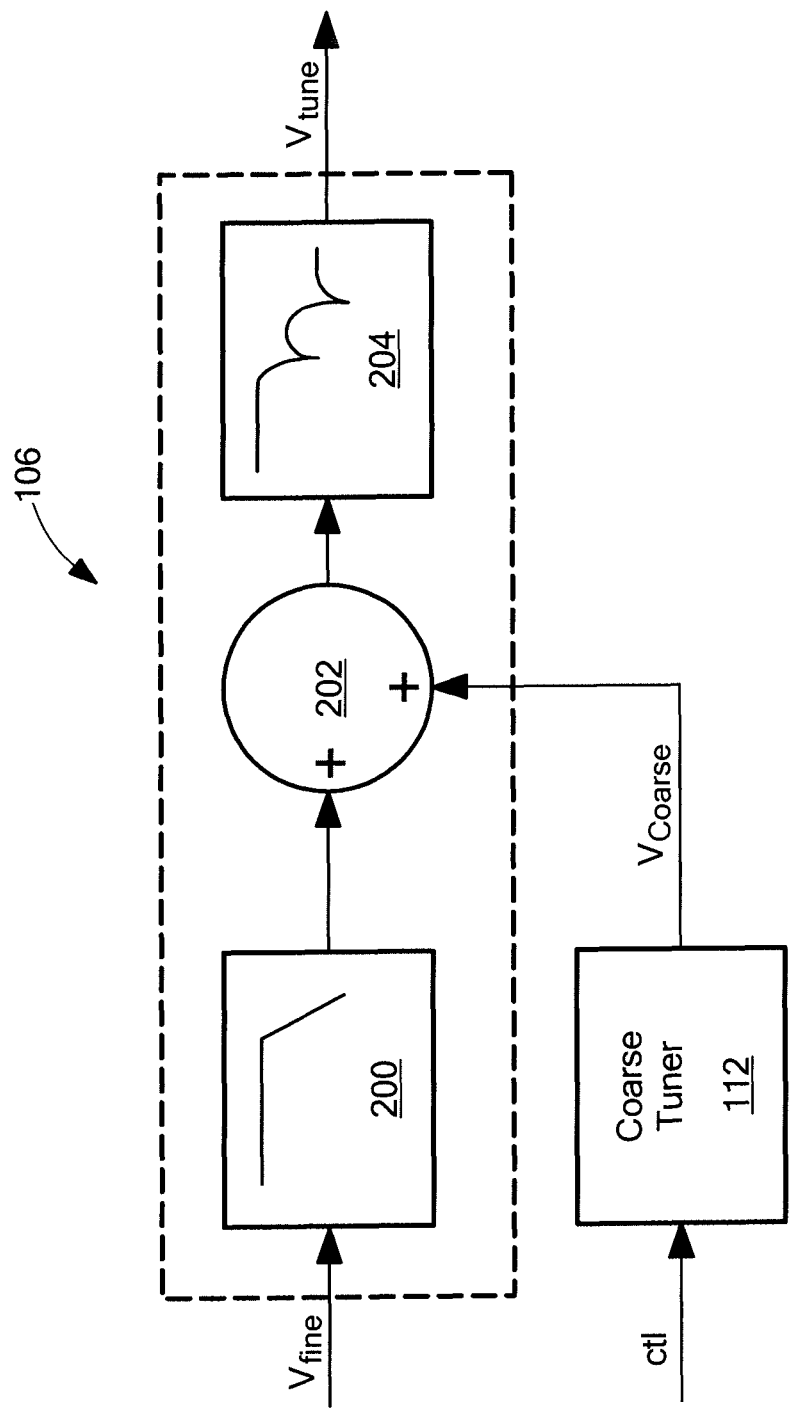
FIG. 2 is a block diagram of a loop filter for use in the PLL of FIG. 1.

Referring now to FIG. 2, in which like elements of FIG. 1 are shown having like reference designations, a high level block diagram of a loop filter 106 for use in a PLL is shown. In general, the loop filter 106 receives a fine tune voltage $V_{fine}$ from a charge pump 104 (FIG. 1) and a coarse tune voltage $V_{coarse}$ from a coarse tuner 112, and provides a final tune signal $V_{tune}$ to a VCO 108 (FIG. 1).

In embodiments, the coarse tune voltage $V_{coarse}$ range can be substantially greater than the fine tune voltage $V_{fine}$ range. For example, in one embodiment, $V_{coarse}$ may be in the range 2.3V+0.255V*n where n=0, 1, 2, . . . 15 and $V_{fine}$ may vary ±0.3V. Thus, it should be appreciated that the loop filter 106 uses external coarse tuning to provide the majority of voltage slew on a PLL from a large current source, thus reducing tune time. In one embodiment, a summing element 202 may be provided to sum the fine tune voltage $V_{fine}$ with a nominal voltage (e.g. +2.5V), such as $V_{nominal}$ shown in FIG. 3. Further, the fine tune voltage $V_{fine}$ may be passed through a bandwidth adjusting network 200 in order to set the PLL loop bandwidth. The summing element 202 and bandwidth adjusting network 200 are discussed further below in conjunction with FIG. 3.

As is known in the art, a PLL may include certain non-linearities which can introduce fractional spurs in the loop output/feedback signal. Thus, in one embodiment, an elliptical filter 204 may be provided, coupled to the summing element 202, to filter a summed tune signal. The elliptical filter 204 may have notches centered at the expected fractional spur frequencies and thus may reduce spurs in the summed tune signal to generate a final tune voltage $V_{tune}$ suitable to tune a VCO 108 (FIG. 1).

Figure 3:
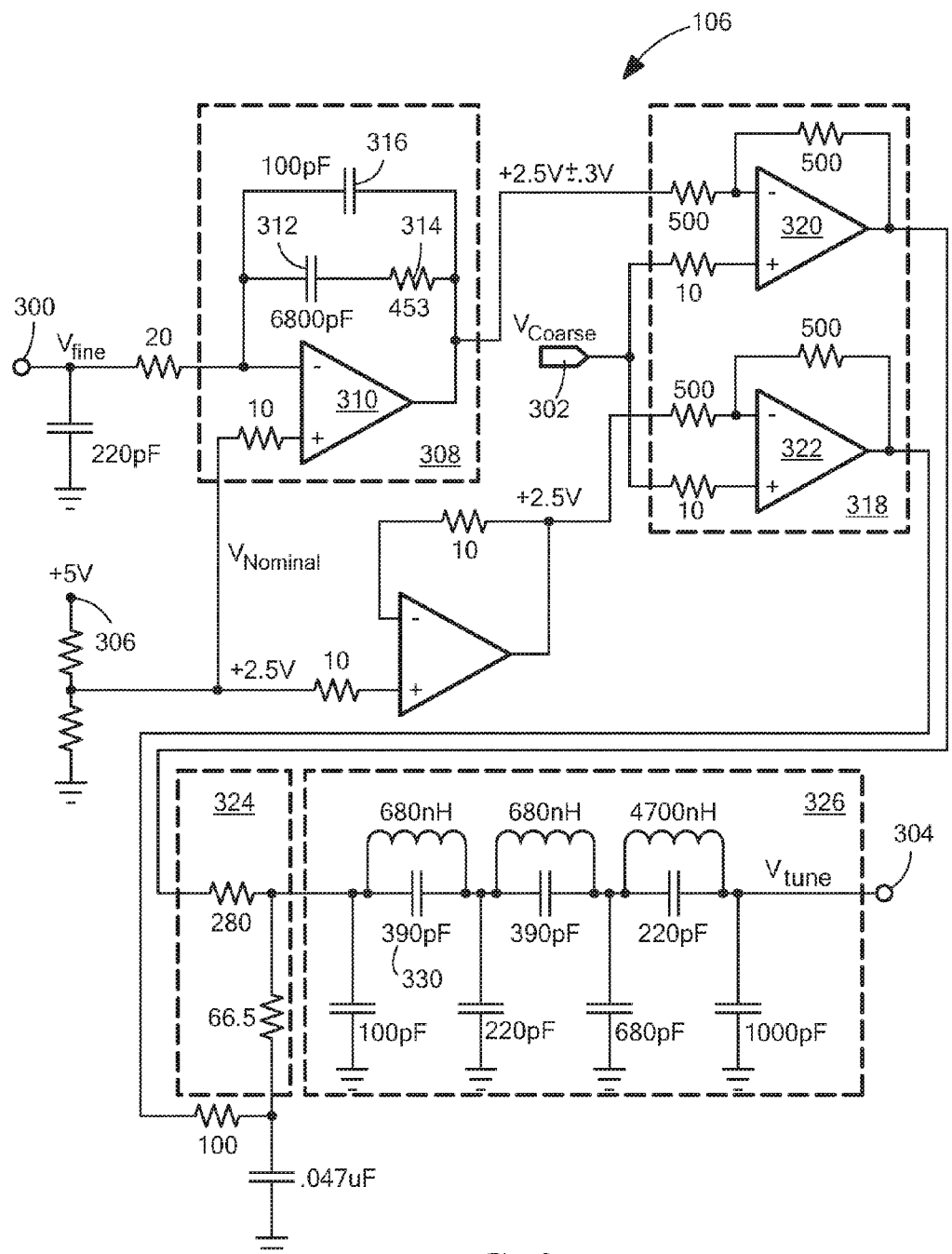
FIG. 3 is an exemplary schematic of the loop filter of FIG. 2.

Referring now to FIG. 3, in which like elements of FIGS. 1 and 2 are shown having like reference, a schematic of a loop filter 106 (also referred to as a "filter circuit") is shown. The filter circuit 106 includes a fine tune input port 300 to receive a fine tune voltage $V_{fine}$, a coarse tune input port 302 to receive a coarse tune voltage $V_{coarse}$, and an output port 304 to provide a final tune signal $V_{tune}$. In addition, a voltage source 306 shifts the input voltage ranges by a nominal voltage $V_{nominal}$ (e.g. +2.5V). For simplicity of explanation, the filter circuit 106 will be described herein with reference to four sub-circuits: a bandwidth adjusting network 308, a summing network 318, a voltage divider 324, and an elliptical filter 326.

It should be appreciated that FIG. 3 shows merely one embodiment of a filter circuit 106 and that different circuit designs, circuit elements, and/or circuit element parameters and part numbers may be used to realize the loop filter of the present disclosure without departing from the scope of the claimed invention.

In an exemplary embodiment, the bandwidth adjusting network 308 includes an operational amplifier ("op-amp") 310 having a negative feedback loop in which the negative and positive terminals of the op-amp 310 are coupled to the fine tune input port 300 and the voltage source 306, respectively. In one embodiment, the op-amp is provided as a Texas Instruments LMH6640. The negative feedback loop may include a first capacitor 312 and a resistor 314, connected in series, and a second capacitor 316 connected in parallel with the first capacitor and resistor. In general, the bandwidth adjusting network 308 receives a fine tune voltage $V_{fine}$ and a nominal voltage $V_{nominal}$, and provides an output voltage range centered about the nominal voltage (e.g. 2.5V±0.3V).

The summing network 318, which may be the same as or similar to summing element 202 in FIG. 2, may include a first op-amp 320 and a second op-amp 322, each having a negative feedback loop. The negative and positive terminals of the first op-amp 320 may be coupled to the bandwidth adjusting network 302 and the coarse tune input port 302, respectively. The negative and positive terminals of the second op-amp 322 may be coupled to the voltage source 306 and the coarse tune input port 302, respectively. Thus, the summing network 318 generally sums the fine tune voltage $V_{fine}$ with the coarse tune voltage $V_{coarse}$ to generate a summed voltage used to tune a VCO.

In the illustrative embodiment, the voltage divider 324 is coupled to the summing network 318 and the elliptical filter 326, as shown. Those skilled in the art will appreciate that voltage divider 324 can limit the phase noise contribution of the loop filter by voltage dividing the filter output, thus reducing the effective tuning sensitivity of a VCO.

The elliptical filter 326 may be coupled to the voltage divider 324 and the output port 304 and may include a plurality of inductor-capacitor pairs (such as inductor 328 and capacitor 330) connected in series, as shown. The elements of the filter 326 and the respective element parameters may be selected such that the filter will have notches centered at the expected fractional spur frequencies. Thus, it will be appreciated that the elliptical filter 326 can attenuate fractional spurs caused by non-linearities in a PLL.

All references cited herein are hereby incorporated herein by reference in their entirety.

Having described exemplary embodiments, which serve to illustrate various concepts, structures and techniques, which are the subject of this patent, it will now become apparent to those of ordinary skill in the art that other embodiments incorporating these concepts, structures and techniques may be used. Accordingly, it is submitted that that scope of the patent should not be limited to the described embodiments but rather should be limited only by the spirit and scope of the following claims.

What is claimed is:

1. A circuit comprising:
   a fine tune input port to receive a fine tune signal;
   a coarse tune input port to receive a coarse tune signal;
   an output port;
   a first summing element coupled to the fine tune and coarse tune input ports to sum the fine tune and coarse tune signals and to output a summed tune signal;
   a voltage divider coupled to the first summing element to receive the summed tune signal and to output a voltage divided signal; and
   a smoothing filter coupled to the voltage divider to smooth the voltage divided signal and output a smoothed signal to the output port.

2. The circuit of claim 1, further comprising:
   a voltage source to output a nominal voltage; and
   a second summing element coupled to the voltage source, the fine tune input port, and the first summing element, the second summing element to sum the fine tune signal and the nominal voltage.

3. The circuit of claim 2, wherein the second summing element comprises an operational amplifier.

4. The circuit of claim 1, wherein the fine tune signal comprises a voltage signal, the coarse tune signal comprises a voltage signal, and a voltage range for the fine tune signal is less than voltage range for the coarse tune signal.

5. The circuit of claim 1, wherein the first summing element comprises an operational amplifier.

6. The circuit of claim 1, wherein the smoothing filter comprises an elliptical filter.

7. A phase-locked loop (PLL) comprising:
   a phase detector;
   a charge pump coupled to receive one or more controls signals from the phase detector and to generate a fine tune signal;
   a coarse tuner;
   a voltage-controller oscillator (VCO); and
   a loop filter coupled to the phase detector, the coarse tuner, and the VCO, the loop filter comprising:
     a fine tune input port to receive the fine tune signal from the charge pump;
     a coarse tune input port to receive a coarse tune signal from the coarse tuner;
     an output port;
     a summing element coupled to the fine tune and coarse tune input ports to sum the fine tune and coarse tune signals and to output a summed tune signal;
     a voltage divider coupled to the summing element to receive the summed tune signal and output a voltage divided signal; and
     a smoothing filter coupled to the voltage divider and the output port to smooth the voltage divided signal and output a final tune signal to tune the VCO.

8. The PLL of claim 7, wherein the charge pump receives an UP control signal and a DOWN control signal from the phase detector.

9. The PLL of claim 7 wherein the coarse tuner comprises a digital-to-analog converter (DAC).

10. The PLL of claim 7 wherein the coarse tuner comprising a multi-throw switch connected to a voltage divider.

11. A circuit comprising:
    a coarse tuning means for providing a coarse tune signal;
    a fine tuning means for providing a fine tune signal;
    a voltage-controller oscillator (VCO), and
    a filtering means for receiving the fine tune and coarse tune signals and providing a final tune signal to the voltage-controlled oscillator (VCO), wherein an amplitude of the final tune signal amplitude is proportional to a sum of an amplitude of the fine tune signal and an amplitude of the coarse tune signal.

12. The circuit of claim 11 wherein the filtering means is further for limiting the effective tuning sensitivity within the final tune signal.

13. The circuit of claim 11 wherein the filtering means is further for attenuating fractional spurs within the final tune signal.

* * * * *